(12) United States Patent
Upadhyayula et al.

(10) Patent No.: US 11,282,746 B2
(45) Date of Patent: Mar. 22, 2022

(54) METHOD OF MANUFACTURING MICROELECTRONIC DEVICES, RELATED TOOLS AND APPARATUS

(71) Applicant: Micron Technology, Inc., Boise, ID (US)

(72) Inventors: Suresh K. Upadhyayula, San Jose, CA (US); Thiam Chye Lim, Singapore (SG)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 16/728,374

(22) Filed: Dec. 27, 2019

(65) Prior Publication Data

US 2021/0202316 A1    Jul. 1, 2021

(51) Int. Cl.
*H01L 21/78* (2006.01)
*H01L 21/268* (2006.01)
*H01L 21/304* (2006.01)
*H01L 21/687* (2006.01)
*H01L 21/67* (2006.01)

(52) U.S. Cl.
CPC ............ *H01L 21/78* (2013.01); *H01L 21/268* (2013.01); *H01L 21/304* (2013.01); *H01L 21/67092* (2013.01); *H01L 21/67103* (2013.01); *H01L 21/67115* (2013.01); *H01L 21/68714* (2013.01)

(58) Field of Classification Search
CPC . H01L 21/78; H01L 21/67092; H01L 21/268; H01L 21/67103; H01L 21/304; H01L 21/68714; H01L 21/67115
USPC .......................................................... 438/463
See application file for complete search history.

(56) References Cited

U.S. PATENT DOCUMENTS

| | | | |
|---|---|---|---|
| 7,088,003 B2 | 8/2006 | Gates et al. | |
| 8,685,838 B2* | 4/2014 | Fukuyo | B23K 26/0604 438/463 |
| 8,916,403 B2* | 12/2014 | Gunther | H01L 27/153 438/33 |
| 10,079,169 B1* | 9/2018 | Hooper | H01L 21/02057 |
| 2003/0176073 A1 | 9/2003 | Ying et al. | |
| 2006/0006805 A1* | 1/2006 | Son | H01J 61/305 313/607 |
| 2007/0066044 A1 | 3/2007 | Abe et al. | |
| 2018/0211824 A1* | 7/2018 | Kudo | H01L 21/3065 |

\* cited by examiner

*Primary Examiner* — Vu A Vu
(74) *Attorney, Agent, or Firm* — TraskBritt

(57) ABSTRACT

A method of manufacturing a microelectronic device may include forming a wiring layer on a first surface of a wafer. The method may also include forming a modified layer along separation regions for each microelectronic device of the wafer by focusing a laser on an inside portion of the wafer. The method may also include removing material from the second surface of the wafer. The wafer may be cooled to a temperature where a low dielectric constant layer extending across the separation regions is brittle while the material is removed from the second surface of the wafer. The method may further include separating the wafer along the separation region to form separate microelectronic devices.

24 Claims, 10 Drawing Sheets

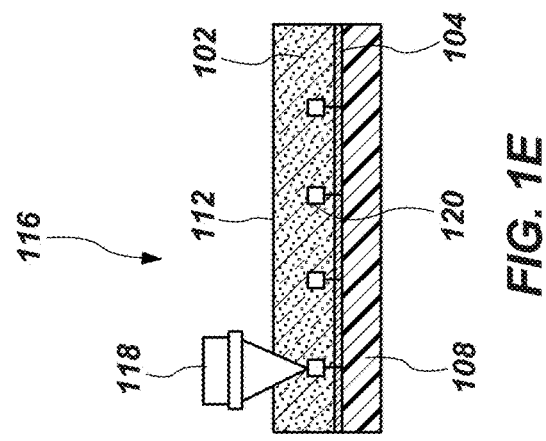
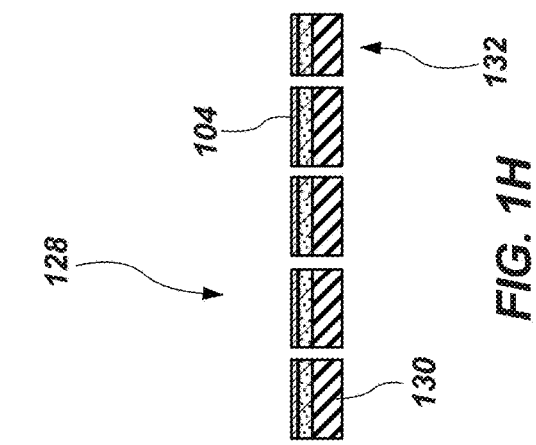
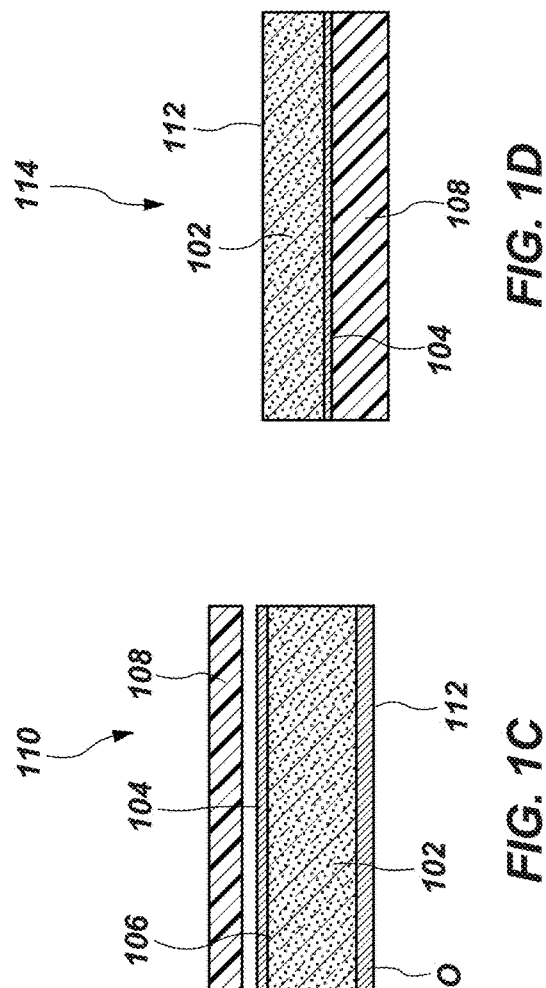
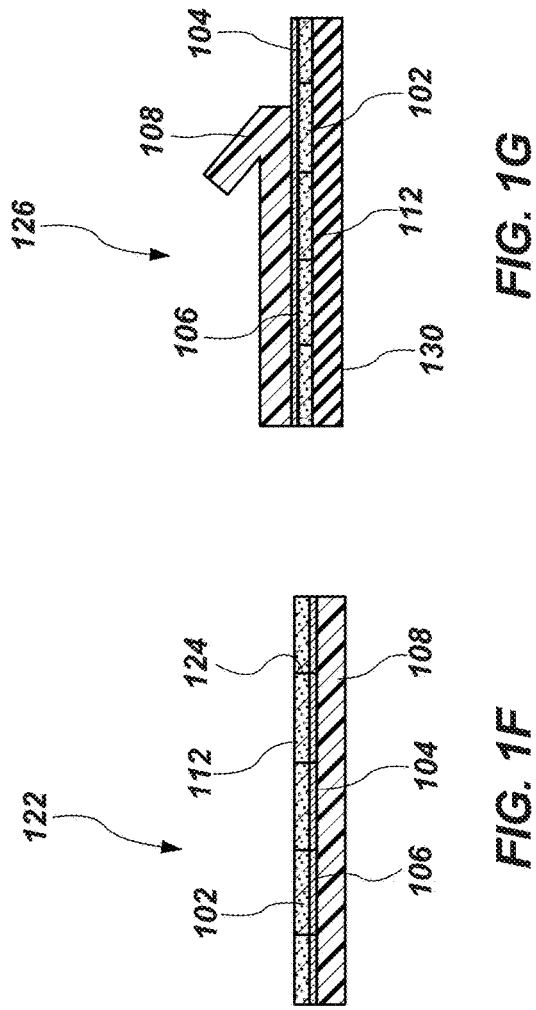

METHOD OF MANUFACTURING MICROELECTRONIC DEVICES, RELATED TOOLS AND APPARATUS

TECHNICAL FIELD

Embodiments of the disclosure relate to a method of manufacturing microelectronic devices. Specifically, some embodiments relate to methods of separating wafers into microelectronic devices, and to related tools and apparatus.

BACKGROUND

Microelectronic devices (e.g., semiconductor dice) may be fabricated by selective deposition, removal and treatment of conductive, semiconductive and insulating materials on and over an active surface of a wafer. Hundreds or even thousands of microelectronic devices may be fabricated in an array of rows and columns of microelectronic device locations on a single wafer. After the microelectronic devices are fabricated on the wafer the wafer may be separated, also characterized as "singulated" into individual microelectronic devices along scribe lines (e.g., streets) defined between the individual microelectronic device locations.

Microelectronic devices are commonly used in consumer electronics such as cell phones, tablets, computers, laptops, etc., as well as in servers and in automotive and industrial applications. As consumer electronic manufacturers continue to produce smaller and thinner versions of the consumer electronics while demanding greater performance and enhanced circuit density, the microelectronic devices have become smaller and thinner to accommodate these requirements. However, as microelectronic devices have become smaller and thinner, irregularities introduced at and near the edges of the microelectronic devices along the scribe lines during the separation process have become a significant issue in terms of yield and mortality. This problem arises in part due to the introduction of low k (k≈1) dielectric materials to enhance scaling of integrated circuitry as conductors and components have become smaller, thinner and ever-closer to one another. Conventional insulating dielectrics such as silicon dioxide cannot be sufficiently thin without charge buildup and crosstalk. On the other hand, low k dielectrics of desirable thinness reduce parasitic capacitance, eliminate crosstalk and enable faster switching speeds. However, polymeric low-k dielectrics commonly employed, such as polyimides, polynorbornenes, benzocyclobutene (BCB) and polytetrafluoroethylene (PTFE) suffer from low mechanical strength, coefficient of thermal expansion (CTE) mismatch with other materials of the microelectronic device, and lack of thermal stability.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

FIGS. 1C-1H are schematic views of a portion of a conventional microelectronic device fabrication sequence after edge trim and in accordance with an embodiment of the present disclosure;

DETAILED DESCRIPTION

The illustrations presented herein are not meant to be actual views of any particular microelectronic device manufacturing operation or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

As used herein the term "brittle" means and includes a state of a material where the material may break under stress with no substantial plastic deformation (e.g., cleanly, without rough finished edges, and/or without plastic deformation).

Microelectronic devices in the form of semiconductor dice are conventionally fabricated on wafers of semiconductor material, most commonly silicon. The microelectronic devices may be manufactured by selective deposition, removal and treatment of conductive, semiconductive and insulating materials on and over an active surface of a wafer in a repeating pattern corresponding to locations for the microelectronic devices. For example, a microelectronic device may include multiple layers of such materials in predetermined patterns forming integrated circuitry on the active surface. After circuitry for the microelectronic devices is completed, the wafer may be thinned by removing material from a back side of the wafer opposite the active surface, and the wafer may then be separated into individual microelectronic devices through a dicing process.

As microelectronic devices and material layers thereof become thinner and more fragile, new methods and tooling may be required to successfully thin and singulate the wafers without damaging the individual microelectronic devices. For example, singulation processes that leave a rough finishing edge such as laser groove dicing may result in reduced microelectronic device yield and quality, due to irregularities in the finishing edge of a singulated device, which irregularities may propagate into the device. One process that may be used to separate the microelectronic devices from the wafer without producing rough finishing edges is a so-called Stealth Dice Before Grind (SDBG) process.

Figure 1A:
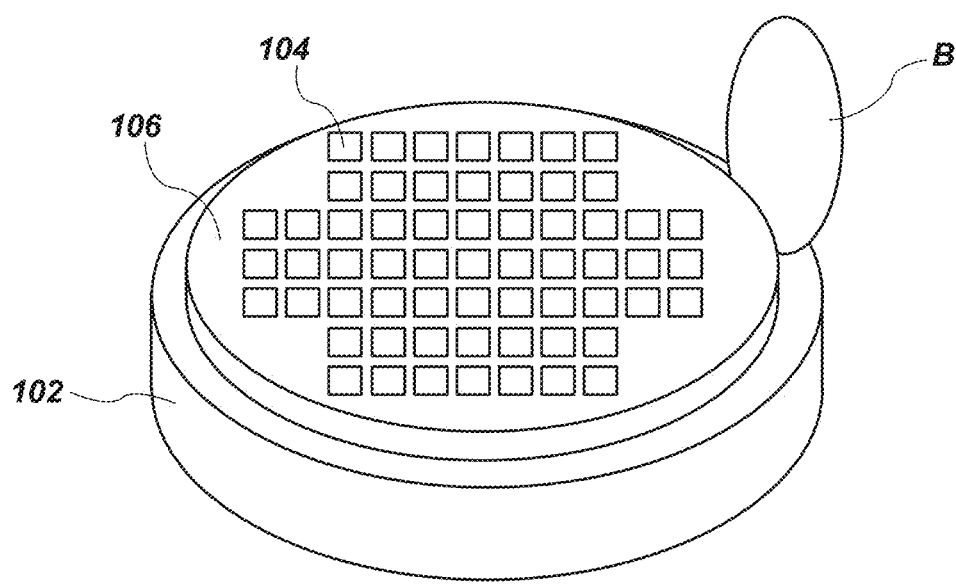
FIGS. 1A and 1B are schematic views of a conventional semiconductor wafer edge trim process.
Figure 1B:
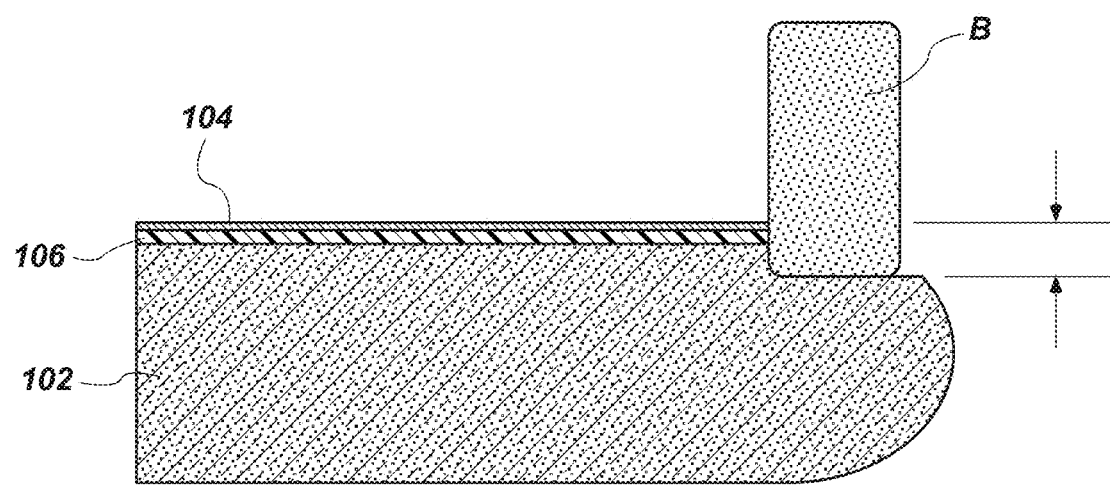

FIG. 1A is a schematic depicting a conventional edge trim process employed prior to an SDBG, wherein a peripheral edge of an unthinned semiconductor (e.g., silicon) wafer 102 of, for example, a thickness of about 600 μm to about 750 μm and having integrated circuitry layers 104 on an active surface 106 thereof is trimmed in a so-called "edge trim" process using a blade B to a depth approximating a final, reduced thickness of semiconductor wafer 102 plus a selected margin. FIG. 1B is an enlarged schematic cross-sectional view of a portion of semiconductor wafer 102 being trimmed by blade B.

FIGS. 1C-1H illustrate a microelectronic device fabrication operation using a conventional SDBG process. First a semiconductor wafer 102 edge trimmed in accordance with FIGS. 1A and 1B has integrated circuitry layers 104 formed in an array of microelectronic device locations on an active surface 106 of the semiconductor wafer 102. In some embodiments, the semiconductor wafer 102 may include low dielectric constant layers (e.g., low k dielectric layers) on the active surface 106 of the semiconductor wafer 102 in association with the integrated circuitry layers 104. For simplicity of illustration, the edge of the full-thickness semiconductor wafer 102 laterally beyond the integrated circuitry layers laterally beyond the microelectronic device locations has been omitted. Once the integrated circuitry layers 104 are formed over the semiconductor wafer 102, a protective tape 108 may be applied over the integrated circuitry layers 104 in a tape lamination process 110. The protective tape 108 may be configured to protect the integrated circuitry layers 104 of semiconductor wafer 102 during the subsequent processing, including removal of semiconductor material from back side 112 of semiconductor wafer 102.

Referring to FIG. 1D, once the protective tape 108 is applied over the integrated circuitry layers 104, the semiconductor wafer 102 may be inverted such that a back side 112 of the semiconductor wafer 102 is facing upward. In a pre-thin process 114 a portion of the wafer 102 in the form of an oxidation layer O on the exposed back side 112 may be removed to facilitate penetration of a laser beam into the wafer 102. After the pre-thin process 114, the wafer 102 may remain substantially thicker than a desired final thickness. The pre-thin process 114 may include a wet etch or polishing process to remove the oxidized portion of material from the back side 112 of the wafer 102.

Referring to FIG. 1E, after the pre-thin process 114, an SDBG process 116 may be performed on the semiconductor wafer 102. The SDBG process 116 may include use of a laser beam 118 that is focused on an inner portion of the semiconductor wafer 102. The laser beam 118 may enter the wafer 102 from the back side 112 of the wafer 102. The laser beam 118 may form, at its focal point, a modified layer 120 of semiconductor material inside the semiconductor wafer 102 comprising weakened regions within the semiconductor wafer 102. For example, the modified layer 120 may be formed through a localized melting of the material of the body of wafer 102 by the laser beam 118, which changes the crystalline structure of the wafer 102 at the location of the weakened region. The modified layer 120 may scan in a pattern corresponding with scribe lines corresponding to separation locations between adjacent microelectronic devices that may be defined in the integrated circuitry layers 104.

Referring to FIG. 1F, in the SDBG process 116, the back side 112 of the wafer 102 may be thinned to a desired thickness in a thinning process 122. The back side 112 of the wafer 102 may be thinned through a grinding process, optionally followed by a polishing process or a wet etch, to a thickness of, for example, between about 30 μm and about 50 μm. As the wafer 102 is thinned, the modified layer 120 may introduce controlled cracks 124 in the wafer 102 and between integrated circuitry layers 104 of the microelectronic device locations responsive to stress from applied force of the grinding process and associated vibrations in the material of the semiconductor wafer 102. The cracks 124 may originate in the modified layer 120 and extend substantially through the semiconductor wafer 102 into and through the active surface 106 along locations between the integrated circuitry layers 104 of the respective microelectronic device locations.

As illustrated in FIG. 1G, after the semiconductor wafer 102 has been thinned from its back side 112 to the desired thickness, the wafer 102 may be inverted such that the active surface 106 is facing upward. The back side 112 of the wafer 102 may be mounted to a die attach film 130 and the protective tape 108 may be removed (i.e., peeled) from the integrated circuitry layers 104 in a mounting and tape peeling process 126.

After the mounting and tape peeling process 126, the semiconductor wafer 102 may be separated into individual microelectronic devices 132 in a die separation process 128, as depicted in FIG. 1H. In the die separation process 128 the die attach film 130 carrying semiconductor wafer 102 may be mounted to a table or chuck that may be configured to cool the wafer 102 to a temperature wherein the die attach film 130 becomes brittle such that any regions of the wafer 102 through which the cracks 124 did not fully propagate may break cleanly under stress applied to separate the microelectronic devices 132 (e.g., without rough finished edges, without plastic deformation) and such that the die attach film 130 may break instead of tearing to provide similarly clean edges.

In some embodiments, when the integrated circuitry layers 104 includes one or more low (i.e., k≈1) dielectric constant layers that extends into the die separation regions, the presence of the low dielectric constant material in a conventional SDBG process 116 may cause damage propagating from microelectronic device side walls formed by the cracks 124 into the microelectronic device in the form of causing tears in, delamination of, or both, of the low dielectric constant material, which may extend into the active area of the device. FIG. 1O illustrates the issue of potential side wall delamination from the scribe (i.e., die edge or sidewall) into the active area (i.e., integrated circuitry) of the die over a relatively short distance from the sidewall. Tears or delaminations in the die separation regions may not have an immediate effect on the microelectronic device 132. However, such a tear or delamination may propagate from the die separation region into an active area of the microelectronic device 132 (e.g., a region where the integrated circuitry layers 104 includes the multiple layers of conductive and insulating material). If the tear or delamination propagates into the active area of the microelectronic device 132 may fail. Thus, tears or delaminations in the die separation region may lead to immediate failures of the microelectronic device 132 and/or early failures (i.e., infant mortality) of the microelectronic device 132.

Figure 2:
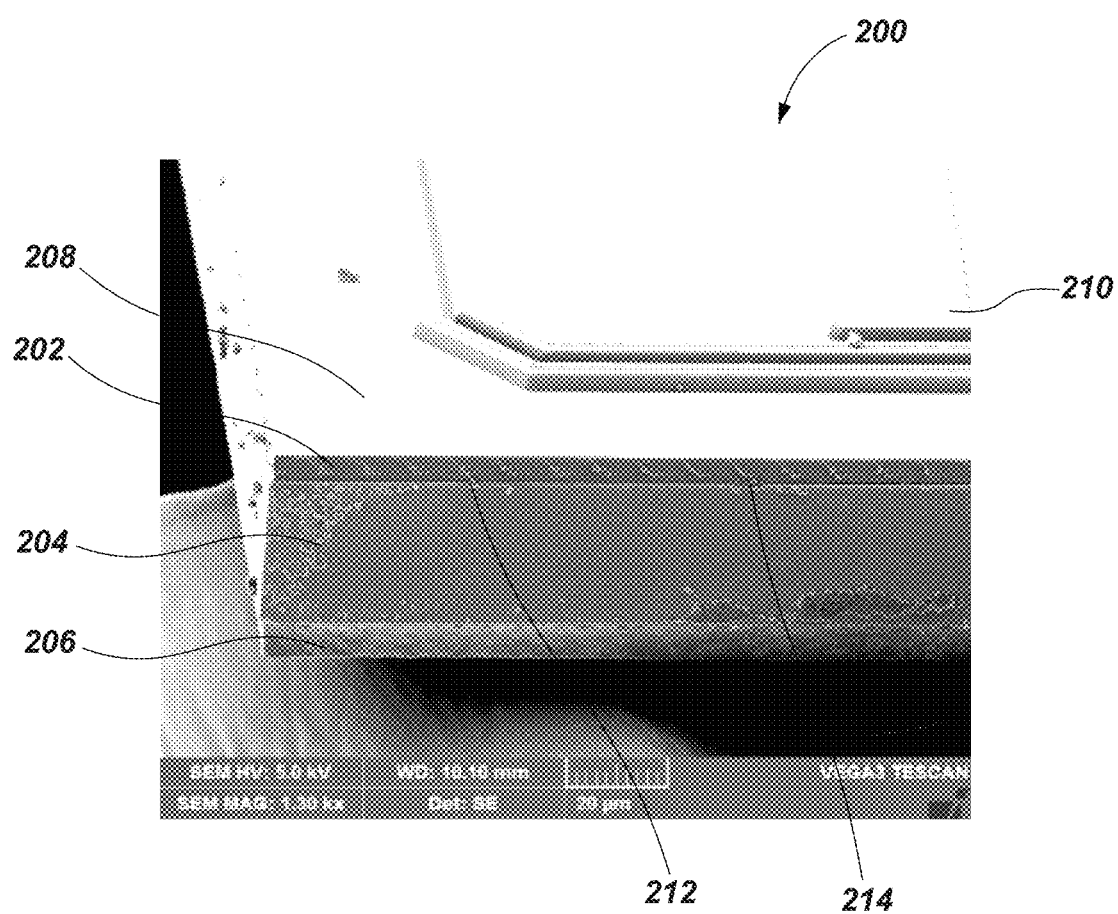
FIG. 2 is a perspective electron microscope view of a microelectronic device singulated by a conventional process.

FIG. 2 illustrates a close up view of a portion of a microelectronic device 200 taken with an electron microscope. The microelectronic device 200 illustrated in FIG. 2 was singulated in a conventional SDBG process similar to that described above in FIGS. 1A-1H. The microelectronic device 200 may include one or more low dielectric constant layers 202 over an active surface of a wafer material 204. The microelectronic device 200 may also include a die attach film 206 applied to a back side of the wafer material 204.

The low dielectric constant layers 202 may extend across a scribe region 208 and integrated circuitry layers 210 may be built up over and between the insulating layers 202 within the microelectronic device circuitry locations. The integrated circuitry layers 210 may include conductive traces, contacts, passive components, external connections, etc., configured to perform, with active circuitry thereunder, the functions of the microelectronic device 200. The scribe region 208 may define regions of a wafer separating multiple adjacent microelectronic device locations where the individual microelectronic devices may be separated from one another. The scribe region 208 lies at a lateral peripheral distance between the integrated circuitry layers 210 and the edges of the microelectronic device 200 that may enable the microelectronic device 200.

Figure 3A:
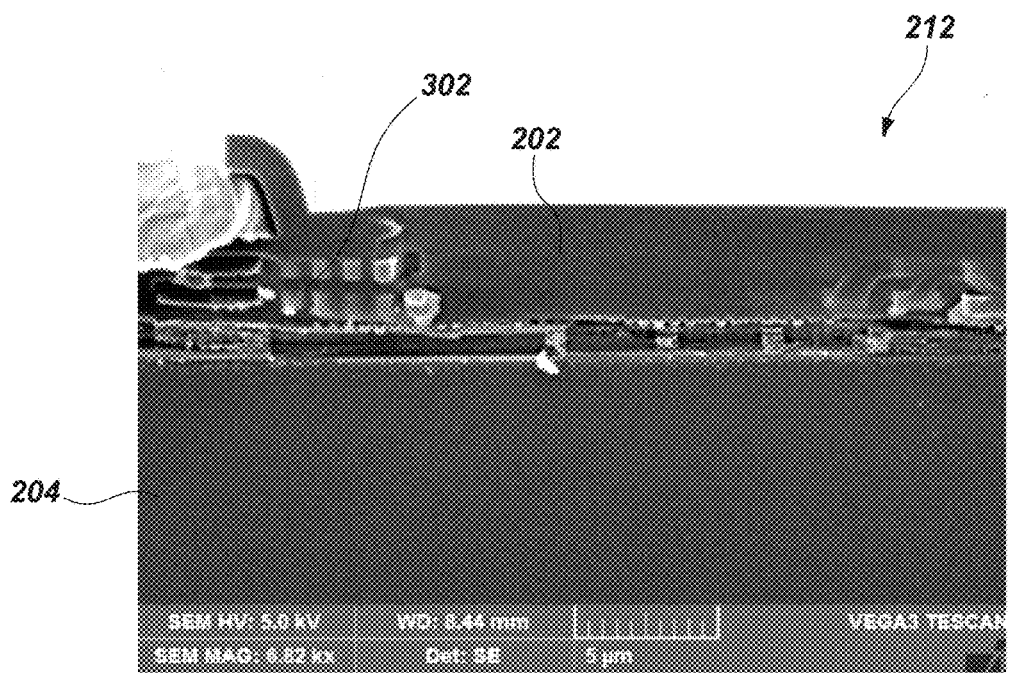
FIG. 3A and FIG. 3B are enlarged electron microscope views of portions of the microelectronic device of FIG. 2.
Figure 3B:
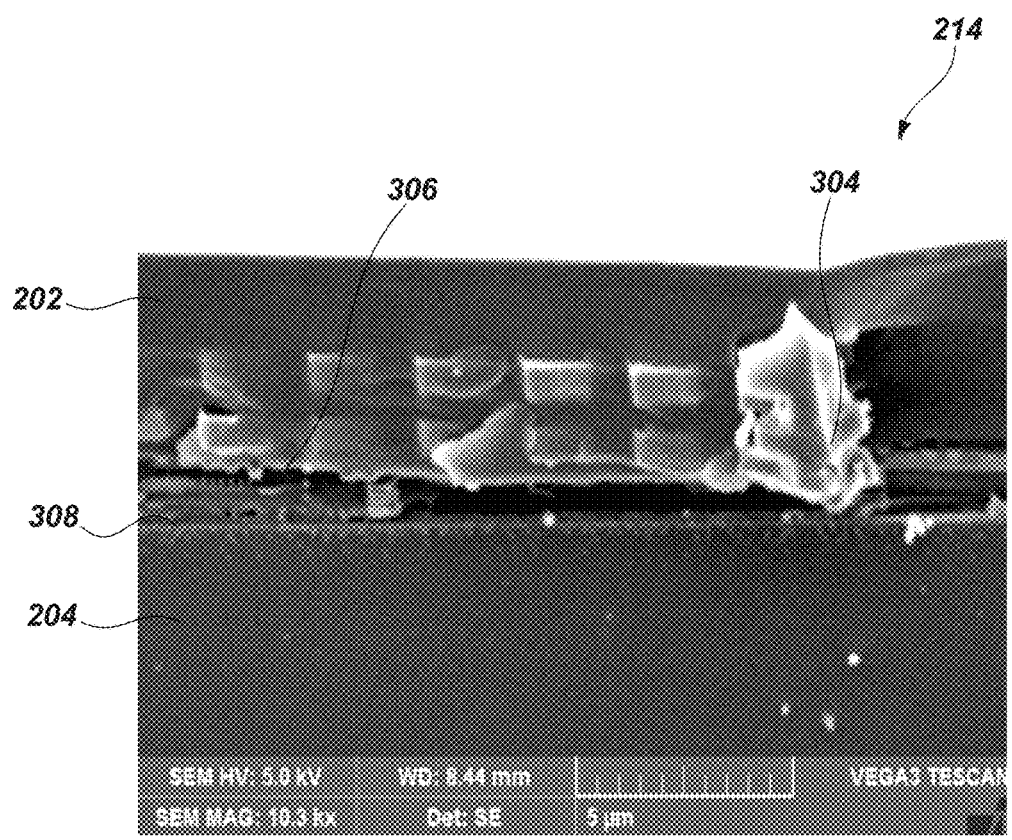

As noted above, the low dielectric constant layers 202 may experience damage along an edge of the scribe region 208 in an SDBG process. For example, the low dielectric constant layers 202 may plastically deform, delaminate or tear, propagating into the microelectronic device from edges of the scribe region 208. FIG. 2 illustrates a first damaged region 212 and a second damaged region 214. FIG. 3A and FIG. 3B illustrate close up views of the first damaged region 212 and the second damaged region 214 respectively.

FIG. 3A illustrates a magnified view of the first damaged region 212 on the microelectronic device 200. The electron microscope image of the low dielectric constant layer 202 illustrates a tear 302. The tear 302 in the low dielectric constant layer 202 may introduce a weak point that may propagate into the integrated circuitry layers 210 and cause the microelectronic device 200 to fail. For example, a fracture in the insulating layer 202 may originate at the tear 302 and extend to the integrated circuitry layers 210 breaking electrical connections within the integrated circuitry layers 210. In some embodiments, the tear 302 may create a weak region in the insulating layer 202 such that under stresses of normal operation such as thermal cycles, vibrations, flexing stresses, etc., a crack or fracture may originate in the weak region around the tear 302 causing shorting and a premature failure of the microelectronic device 200.

FIG. 3B illustrates a magnified view of the second damaged region 214 on the microelectronic device 200. The electron microscope image of the low dielectric constant layer 202 illustrates a tear 304 and a delamination 306 of the low dielectric constant layer 202 from the active surface 308 of the wafer material 204. The tear 304 may introduce a weak point that may propagate into the integrated circuitry layers 210 and cause the microelectronic device 200 to fail. The delamination 306 may propagate to the integrated circuitry layers 210 causing at least a portion of the integrated circuitry layers 210 to delaminate from the active surface 308 of the wafer material 204 and cause the microelectronic device 200 to fail. In some embodiments, the delamination 306 and/or tear 304 may not propagate into the integrated circuitry layers 210 before the microelectronic device 200 is installed into higher level packaging of an electronic device. The delamination 306 and/or tear 304 may propagate at a later time causing a premature failure of the microelectronic device 200 and ultimately a premature failure of the electronic device.

Figure 10:
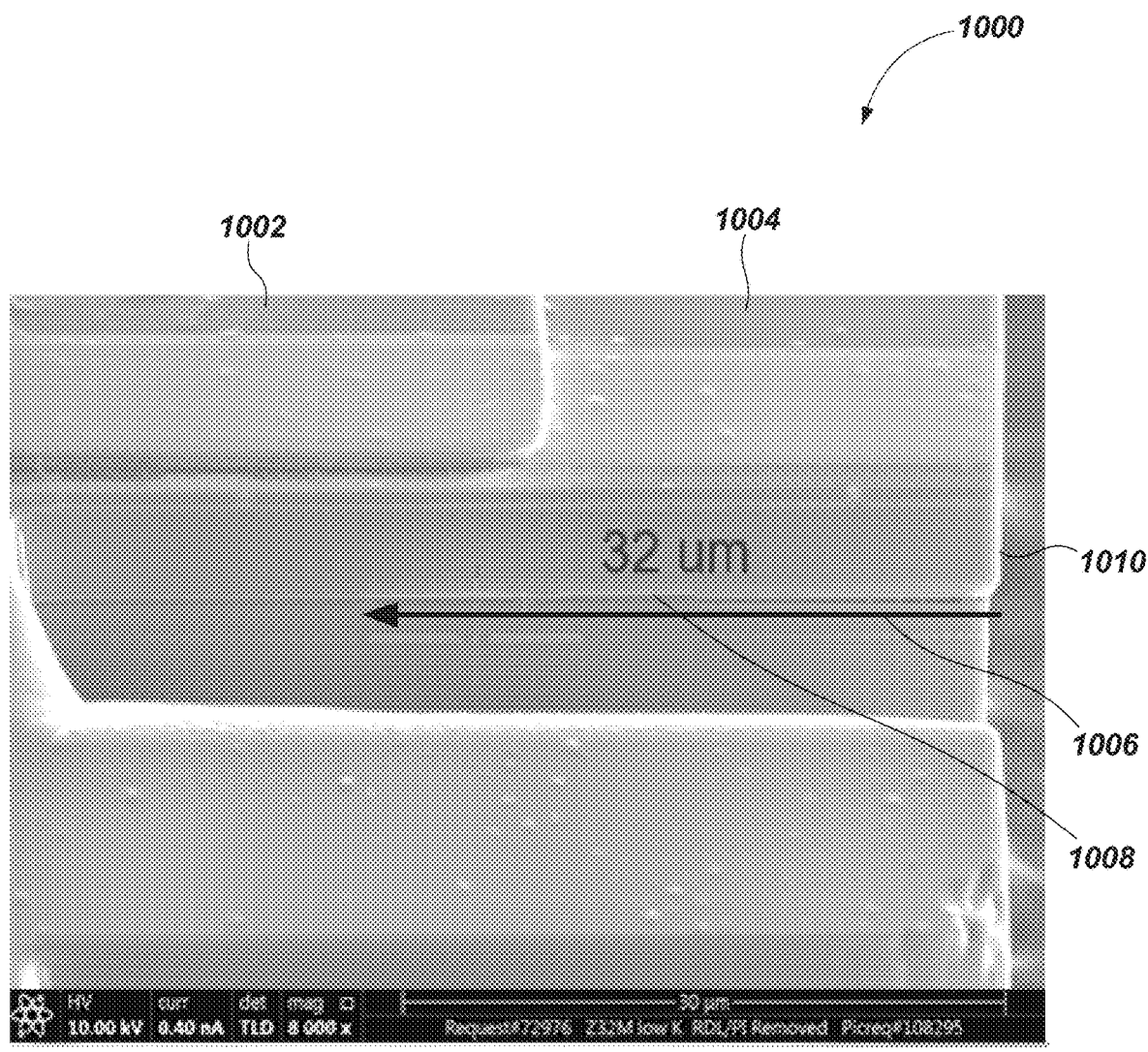
FIG. 10 is an enlarged electron microscope view of a portion of a semiconductor die adjacent a side wall thereof after singulation.

FIG. 10 illustrates an magnified view of a microelectronic device 1000 singulated in an SBDG process similar to that described above in FIGS. 1A-1H. The microelectronic device 1000 may include an active area 1002 and a scribe region 1004 peripherally surrounding active area 1002. Integrated circuitry layers including active and passive circuitry, conductive traces, contacts, vias and external connections, etc., may be built up in the active area 1002, whereas the scribe region 1004 is devoid of circuitry and conductors. Thus, the scribe region 1004 provides a distance between the active areas 1002 and a side wall 1010 of the microelectronic device.

As described above, plastic deformation of a low dielectric constant layer in the scribe region 1004 may cause a delamination 1008 between the layers of the microelectronic device 1000 in the scribe region 1004. The delamination 1008 may propagate along arrow 1006 until the delamination 1008 reaches the active area 1002 causing the microelectronic device 1000 to fail. In some cases, the delamination 1008 may propagate into the active area 1002 causing the microelectronic device 1000 to fail during testing, affecting yield of the microelectronic devices 1000 from a wafer. In some cases, the delamination 1008 may propagate into the active area 1002 under stresses of normal operation such as thermal cycles, vibrations, flexing stresses, etc., causing a premature failure of the microelectronic device 1000.

Some embodiments of the present disclosure may include a stealth dicing method. The method may include focusing a laser beam within a wafer comprising microelectronic devices to form scribe lines. The scribe lined may include modified semiconductor material between the multiple microelectronic devices. The method may further include thinning the wafer while the wafer is maintained at a sufficiently cold temperature to cause dielectric material of the microelectronic devices in alignment with the scribe lines to become brittle. The method may also include fracturing the thinned wafer and the dielectric material of the microelectronic devices along boundaries corresponding to the scribe lines.

Figure 4:
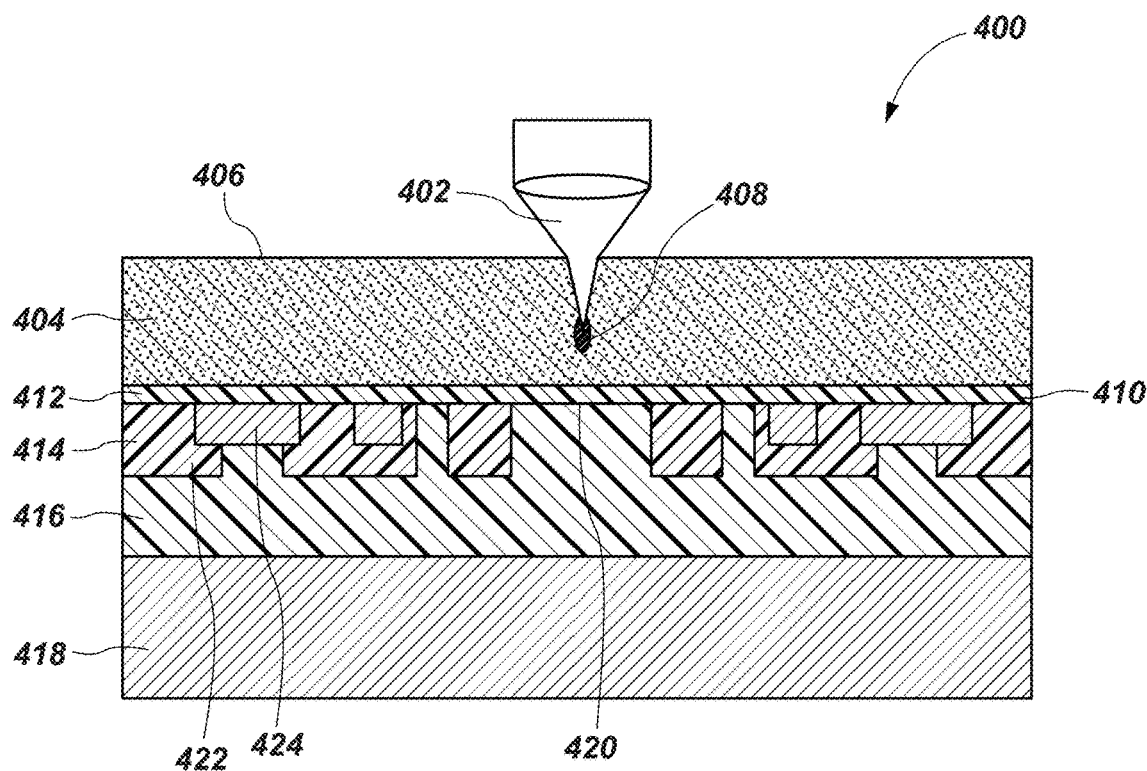
FIG. 4 illustrates a cross-sectional view of a wafer assembly during a portion of a microelectronic device separation process in accordance with an embodiment of the present disclosure.

FIG. 4 illustrates a cross sectional view of a portion of a wafer assembly 400 during an SDBG process. A laser beam 402 may penetrate a wafer 404 from a rear side 406 (e.g., back side) of the wafer 404. The laser beam 402 may be configured to focus on an interior portion of the wafer 404. The laser beam 402 may create a modified region 408 in the interior portion of the wafer 404 where the laser beam 402 is focused. The modified region 408 may be formed by locally melting the wafer 404 in the modified region 408 at the focal point of the laser beam. Melting the semiconductor material of wafer 404 may change chemical and/or physical properties of the wafer 404 in the modified region 408, forming a weakened region in the interior of the wafer 404.

An insulating layer 412 may be positioned over a front side 410 (e.g., active surface) of the wafer 404. In some embodiments, the insulating layer 412 may include one or more insulating layers. One or more of the insulating layers may consist of a low dielectric constant material (e.g., a low-K dielectric layer). The low dielectric constant layer may be formed from a material having a dielectric constant about 1, such as a polymer material (e.g., polyimides, polynorbornenes, benzocyclobutene, PTFE, hydrogen silsesquioxane (HSQ), methylsilsesquioxane (MSQ), etc.), SiCOH (e.g., BLACK DIAMOND™), CORAL™, etc. A wiring layer 414 may be formed over the insulating layer 412. The wiring layer 414 may include layers of insulating material 422 interspersed with layers of conducting material 424. The layers of insulating material 422 and conducting material 424 may be formed into features of a microelectronic device, such as bonding pads, wiring paths, vias, active and passive circuitry, etc.

In some embodiments, the wiring layer 414 may have discontinuities between locations of microelectronic device, the discontinuities providing scribe lines 420 (e.g., streets, separation regions, etc.) that are substantially free from the features of the microelectronic device formed from the insulating material 422 and the conducting material 424. Thus, scribe lines 420 may define locations along which the semiconductor wafer 404 may be safely separated into separate microelectronic devices without damage.

A protective tape 416 may be positioned over the wiring layer 414. The protective tape 416 may be configured to protect the wiring layer 414 from damage due to physical contact and/or environmental conditions. For example, the wafer assembly 400 may be secured with a wafer securing tool such as a chuck 418 during the SDBG process. Physical contact with the chuck 418 may cause damage to the wiring layer 414 without the intervening protective tape 416. In some embodiments, the environmental conditions may include chemicals and/or gasses that may damage components in the wiring layer 414. In some embodiments, the wafer chuck 418 may include a suction device configured to secure the wafer 404 using vacuum. In some embodiments, the wafer securing tool 418 may include a chuck or table configured to mechanically secure the wafer assembly 400.

The modified region 408 may be substantially aligned with the scribe lines 420. For example, the modified region 408 may be substantially vertically aligned with the scribe lines 420, such that the modified region 408 forms a weakened region in the wafer 404 that is substantially aligned with the scribe lines 420.

It is contemplated wafer assembly 400 may undergo cooling during the SDBG process in preparation for thinning. Specifically, wafer assembly 400 may be mounted to a wafer securing tool 418 (e.g., chuck) as described with respect to FIG. 5, which tool 418 is configured to cool wafer assembly 400 during the SDBG process to conserve thermal budget of the wafer 404 and maintain integrity of the low dielectric constant layer or layers of insulating layer 412. In some embodiments, the wafer securing tool 418 may also serve as the wafer securing tool 504 employed in the thinning process undertaken subsequent to the SDBG process, as described below, to avoid the need to transfer wafer assembly 400 to a new support structure and to eliminate equipment redundancy.

Figure 5:
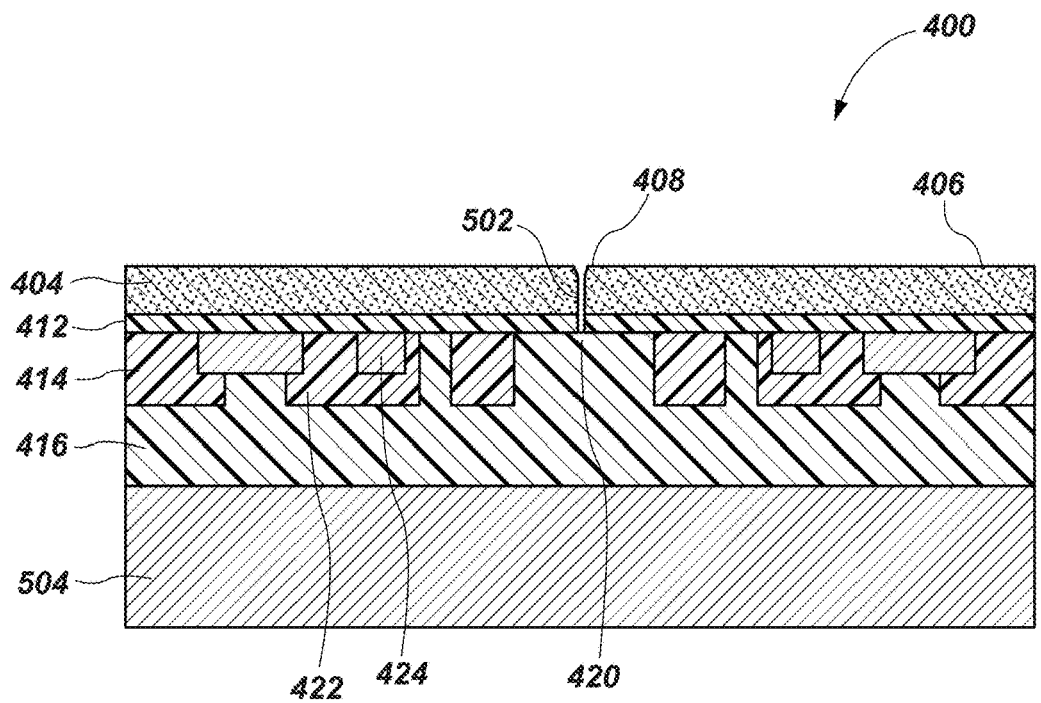
FIG. 5 illustrates a cross-sectional view of the wafer assembly of FIG. 4 during a portion of a microelectronic device separation process in accordance with an embodiment of the present disclosure.

FIG. 5 illustrates the wafer assembly 400 during a thinning process according to an embodiment of the disclosure. The thinning process may include grinding (e.g., back grinding) and polishing. For example, material may be removed from the rear side 406 of the wafer 404, thinning the wafer 404 to a desired thickness. As discussed above, SDBG processes may enable a final thickness of the resulting microelectronic devices to be very thin while maintaining the integrity of the individual microelectronic devices. In some embodiments, the final thickness may be between about 20 microns and about 100 microns, such as between about 25 microns and about 75 microns, or between about 35 microns and about 40 microns. As the wafer 404 is thinned the weakened region in the modified region 408 may introduce a crack 502 through the wafer 404 and the insulating layer 412.

During the thinning process the wafer assembly 400 may be mounted to a wafer securing tool 504 configured to secure the wafer assembly 400 relative the wafer grinder and/or polisher. In some embodiments, the wafer securing tool 504 may include a suction device configured to secure the wafer assembly 400 to the wafer securing tool 504 using vacuum, such as a vacuum chuck. In some embodiments, the wafer securing tool 504 may include a chuck or table configured to mechanically secure the wafer assembly 400. An apparatus suitable for use in the thinning process is described in further detail below with respect to FIG. 9.

The wafer securing tool 504 may be configured to cool the wafer assembly 400 to a temperature lower than room temperature. For example, the wafer securing tool 504 may be maintained at a cold temperature such that heat of the wafer assembly 400 is dissipated into the wafer securing tool 504, lowering a temperature of the wafer assembly 400. The temperature of the wafer assembly 400 may approach the temperature of the wafer securing tool 504 during the thinning process. For example, the wafer securing tool 504 may maintain the wafer assembly 400 at a temperature between about 0 degrees Celsius and about 3 degrees Celsius greater than the temperature of the wafer securing tool 504.

In some embodiments, the wafer securing tool 504 may be cooled by flowing a cooling fluid through the wafer securing tool 504. For example, a cooling liquid such as a water and antifreeze mixture, a refrigerant (e.g., R134a, R-12, R-410A, R-22, R-404A, etc.), ammonia, or a cryogenic fluid (e.g., liquid nitrogen, liquid hydrogen, etc.) may be pumped through cooling ports, pathways, or passages in the wafer securing tool 504. In some embodiments, the cooling liquid may transfer heat from the wafer securing tool 504 and dissipate the heat through a refrigeration process that may include an evaporator and compressor, such as a chiller. In some embodiments, the cooling liquid may transfer heat to a secondary cooling fluid through a heat exchanger such as an evaporator, a finned tube, a coil, a plate heat exchanger, etc., and the secondary cooling fluid may pass through the refrigeration process. In some embodiments, the wafer securing tool 504 may be air-cooled. For example, cold air may be passed over cooling fins or through cooling passages in the wafer securing tool 504. In some embodiments, the cold air may be dehumidified and/or purified air. In some embodiments, the cold air may be a purge gas configured to substantially remove contaminants and/or humidity. The cold air may be cooled in a refrigeration device. For example, a refrigeration device may remove heat from the air in a heat exchanger such as an evaporator, a finned tube, a coil, a plate heat exchanger, a rotary heat exchanger (e.g., enthalpy wheel), etc.

The wafer securing tool 504 may be cooled to maintain the wafer assembly 400 at a temperature that renders the insulating layer 412 brittle. In some embodiments, the wafer assembly 400 may be maintained at a temperature between about −10 degrees Celsius and about 5 degrees Celsius, such as between about 0 degrees Celsius and about 3 degrees Celsius, or between about 0 degrees Celsius and about 1 degree Celsius. It is desirable to maintain the temperature of the wafer securing tool 504 and the wafer assembly 400 at a sufficiently high a temperature which will still render insulating layer 412 brittle, to avoid condensation issues associated with sub-zero Celsius temperatures.

As the wafer 404 is thinned in the thinning process, stress concentrations around the modified region 408 may cause a crack 502 to form. The crack 502 may originate at the modified region 408 and propagate through the wafer 404. The crack 502 may also propagate through the brittle insulating layer 412 and create a clean break (e.g., without tears and/or delaminations) between microelectronic devices of the wafer. Where the modified region 408 is substantially aligned with the scribe lines 420, the crack 502 may propagate through the insulating layer 412 within the scribe lines 420 substantially separating the wafer assembly 400 along the scribe lines 420 into individual microelectronic devices.

Figure 6:
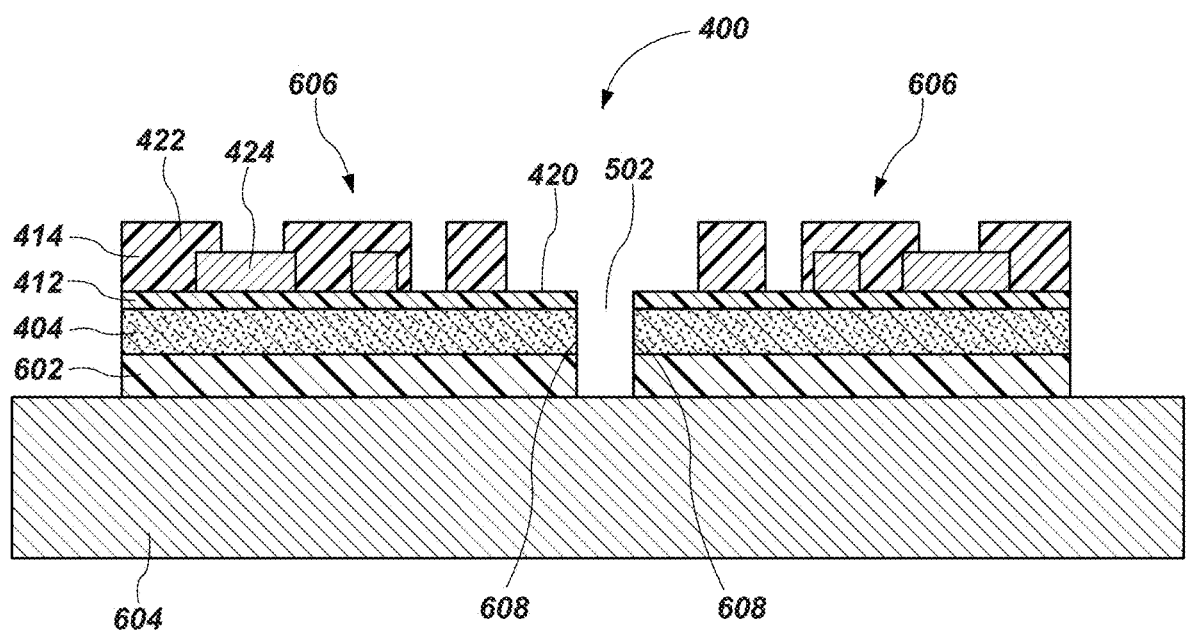
FIG. 6 illustrates a cross-sectional view of the wafer assembly of FIG. 4 during a portion of a microelectronic device separation process in accordance with an embodiment of the present disclosure.

FIG. 6 illustrates the wafer assembly 400 during the die separation process. In an intermediary step a die attach film 602 may be applied to the thinned rear side 406 of the wafer 404 and the protective tape 416 may be removed from the wiring layer 414. The die attach film 602 to which the wafer assembly 400 is mounted may be coupled to a die separation tool 604 during the die separation process.

The die separation tool 604 may be configured to cool the wafer assembly 400 to a temperature lower than room temperature. For example, the die separation tool 604 may be maintained at a cold temperature such that heat from the wafer assembly 400 is dissipated into the die separation tool 604, lowering a temperature of the wafer assembly 400. The temperature of the wafer assembly 400 may approach the temperature of the die separation tool 604 during the die separation process. For example, the die separation tool 604 may maintain the wafer assembly 400 at a temperature between about 0 degrees Celsius and about 3 degrees Celsius greater than the temperature of the die separation tool 604.

In some embodiments, the die separation tool 604 may be cooled by flowing a cooling fluid through the die separation tool 604. For example, a cooling liquid such as water, refrigerant, ammonia, or a cryogenic fluid may flow through cooling ports, pathways, or passages in the die separation tool 604. In some embodiments, the cooling liquid may transfer heat from the die separation tool 604 and dissipate the heat through a refrigeration process that may include an evaporator and compressor, such as a chiller. In some embodiments, the cooling liquid may transfer heat to a secondary cooling fluid through a heat exchanger such as an evaporator, a finned tube, a coil, a plate heat exchanger and the secondary cooling fluid may pass through the refrigeration process. In some embodiments, the die separation tool 604 may be air-cooled. For example, cold air may be passed over cooling fins or through cooling passages in the die separation tool 604. In some embodiments, the cold air may be dehumidified and/or purified air. In some embodiments, the cold air may be a purge gas configured to substantially remove contaminants and/or humidity. The cold air may be cooled in a refrigeration device. For example, a refrigeration device may remove heat from the air in a heat exchanger such as an evaporator, a finned tube, a coil, a plate heat exchanger, a rotary heat exchanger, etc.

The die separation tool 604 may be configured to maintain the wafer assembly 400 at a temperature that renders the material of the die attach film 602 brittle. In some embodiments, the wafer assembly 400 may be maintained at a temperature between about −15 degrees Celsius and about 5 degrees Celsius, such as between about 0 degrees Celsius and about 5 degrees Celsius, or between about 0 degrees Celsius and about 1 degree Celsius.

The die separation tool 604 may be configured to expand the die attach film 602 and, thus, the wafer assembly 400 radially once the die attach film is coupled to the die separation tool 604. As the die separation tool 604 expands the wafer assembly 400 radially, the wafer assembly 400 may separate into individual microelectronic devices 606 along the scribe lines 420 substantially following the crack 502. The now-brittle die attach film 602 may fracture substantially in line with the crack 502 such that sides 608 of the microelectronic devices 606 are substantially clean (e.g., straight, smooth, without tears and/or delaminations, etc.).

Some embodiments of the present disclosure may include a method. The method may include supporting a semiconductor wafer comprising microelectronic devices including low k dielectric material over an active surface thereof. The method may further include scanning a laser beam into the semiconductor wafer from a back side thereof along scribe lines between adjacent microelectronic devices. A focal point of the laser may be at a depth inside the semiconductor wafer. The method may also include cooling the semiconductor wafer to a temperature where the low k dielectric constant layer is brittle. The method may further include removing material from the back side of the cooled semiconductor wafer and inducing separation of the microelectronic devices.

Figure 7:
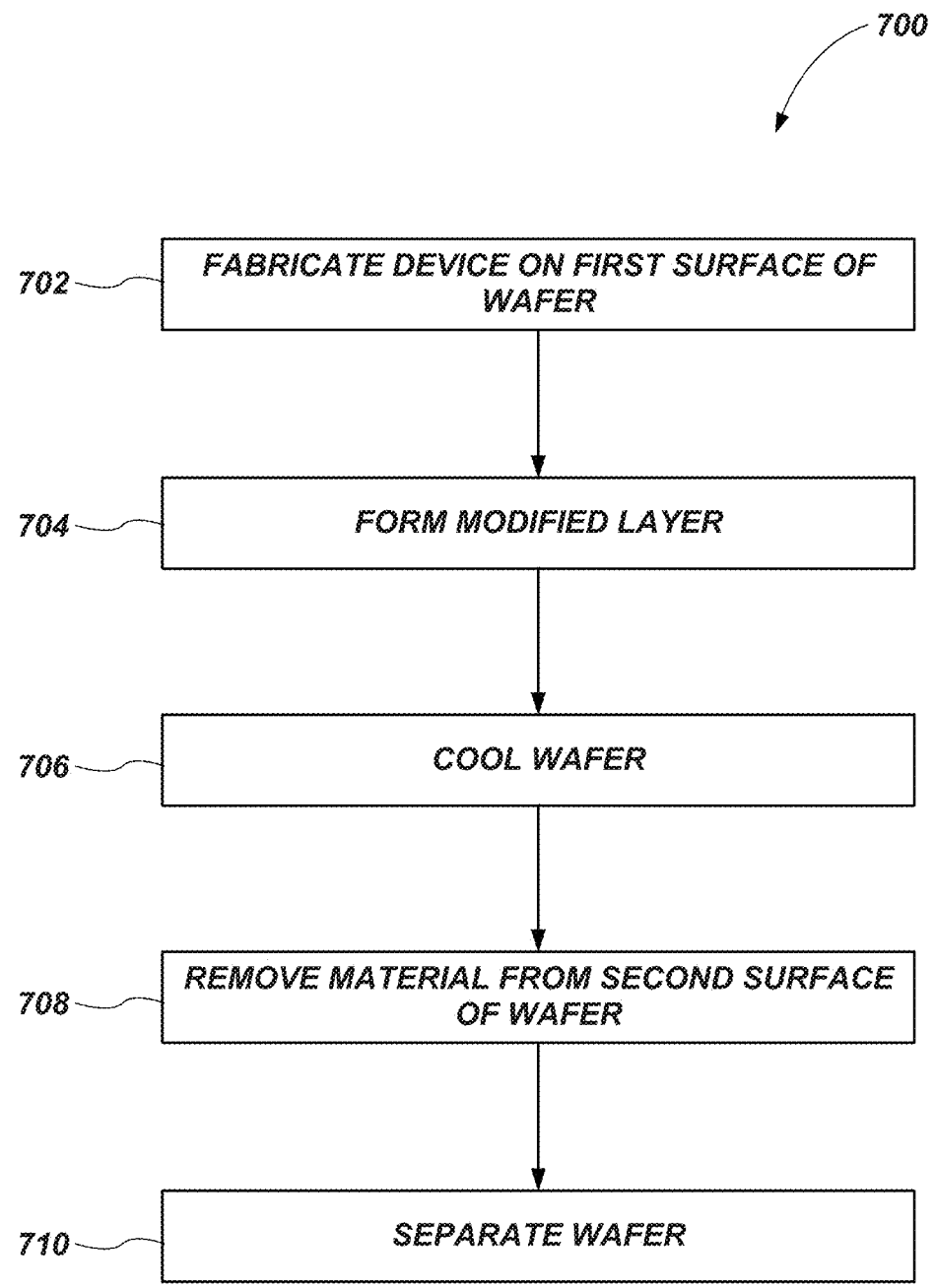
FIG. 7 illustrates a flow chart representative of a method of fabricating microelectronic devices in accordance with an embodiment of the present disclosure.

FIG. 7 illustrates a flow chart representative of a method 700 of manufacturing a microelectronic device. A wafer may serve as a workpiece for fabrication of multiple microelectronic devices. The microelectronic devices may be fabricated on an active surface of the wafer, as illustrated in process act 702. Fabricating the microelectronic devices may include applying one or more insulating layers, beneath, between and over conductive elements and components. The insulating layers may comprise a low dielectric constant polymer material. Discontinuities between integrated circuitry of adjacent microelectronic device locations may define streets (e.g., separation regions, scribe lines, etc.) between the microelectronic devices on the wafer. The streets may be substantially free from features of the microelectronic devices. In some embodiments, the streets may include testing connections configured to enable a connection between testing equipment and the wiring layer through an end of each microelectronic device after the microelectronic devices are separated from the wafer.

After the microelectronic devices are fabricated on the active surface of the wafer a protective material may be applied over the microelectronic devices. The protective material may be a protective tape, a protective layer, etc. The protective material may be configured to protect the active surface of the wafer and integrated circuitry of the microelectronic devices from environmental and physical hazards within the microelectronic device manufacturing operation. For example, the protective material may protect the microelectronic devices from damage when coming into contact with tooling. In some embodiments, chemicals, vapors, lighting, lasers, etc., that may be used in the microelectronic device fabrication operation may be harmful to the one or more components of the microelectronic devices. The protective layer may provide an intermediary layer between the microelectronic devices the surrounding environment, thereby protecting the microelectronic devices from any potentially harmful chemicals, vapors, lighting, lasers, etc. In some embodiments, debris, contaminants, and/or particulates may be in the air, such as particulates resulting from another process. The protective layer may prevent contamination of the microelectronic devices from any debris, contaminants, and/or particulates.

After the microelectronic devices are fabricated on the active surface of the wafer, a modified layer may be formed inside the wafer in process act 704. The modified layer may be formed by a laser. For example, a laser beam may be focused on an interior portion of the wafer. In some embodiments, the laser may locally melt the wafer in the location where the laser is focused creating a weakened region of the wafer. The laser beam may pass through a rear side of the wafer opposite the active surface of the wafer. The modified layer may be substantially aligned with the streets between the microelectronic devices. In some embodiments, the modified layer may be located a distance from the active surface of the wafer. In some embodiments, the distance from the active surface may be substantially equal to the final desired thickness of the microelectronic devices. The modified layer may be configured to serve as a starting point for a separation crack between the microelectronic devices.

After the modified layer is formed in the wafer, the wafer may be cooled in process act 706. The wafer may be positioned on a cooled tool such as a cold chuck or cold table configured to lower a temperature of the wafer to a desired temperature. The desired temperature of the wafer may be a temperature where at least the insulating base layers become brittle. In some embodiments, the desired temperature of the wafer may be between about −10 degrees Celsius and about 5 degrees Celsius, such as between about 0 degrees Celsius and about 3 degrees Celsius, or between about 0 degrees Celsius and about 1 degree Celsius. The cooled tool may be maintained at a temperature below the desired temperature of the wafer. For example, the cooled tool may be maintained at a temperature between about 1 degree Celsius and about 3 degrees Celsius below the desired temperature of the wafer. Thus, if the desired temperature of the wafer is between about 0 degrees Celsius and about 1 degree Celsius, the cooled tool may be maintained between about −4 degrees Celsius and about 0 degrees Celsius. In some embodiments, the wafer may be cooled while the modified layer is formed by the laser. For example, the wafer may be positioned on a cooled chuck or other support while the modified layer is formed.

After the wafer is cooled in process act 706, material may be removed from the back side of the wafer in process act 708. The material may be removed until the wafer reaches a desired thickness of the microelectronic devices. The desired thickness may be between about 20 microns and about 100 microns. The desired thickness may depend on the type of microelectronic device. For example, the desired thickness of some microelectronic devices may be between about 40 microns and about 100 microns, such as between about 40 microns and about 75 microns. In some embodiments, the desired thickness may be between about 20 microns and about 40 microns, such as between about 30 microns and about 35 microns or between about 20 microns and about 25 microns.

The wafer material may be removed through a material removal process such as back grinding or polishing. As the material is removed stresses inherent in the removal process may be greater in the weakened region around the modified layer such that a crack may originate at the modified layer and extend through the wafer and the insulating base layers along the streets. The cooled wafer may enable the crack to propagate cleanly through the brittle insulating base layers.

After the wafer is thinned to the desired thickness of the microelectronic devices, a die attach film may be applied to the back side of the wafer and the protective material may be removed from the microelectronic devices.

The wafer may be coupled to a die separation tool in process act 710. The die separation tool may be coupled to the die attach film. In some embodiments, the die separation tool may be a cooled tool, such as a cold chuck or cold table configured to cool the wafer to a second desired temperature. The second desired temperature of the wafer may be a temperature where the die attach film and/or the wafer becomes brittle. In some embodiments, the second desired temperature of the wafer may be between about −15 degrees Celsius and about 5 degrees Celsius, such as between about 0 degrees Celsius and about 5 degrees Celsius, or between about 0 degrees Celsius and about 1 degree Celsius. The die separation tool may be maintained at a temperature below the second desired temperature of the wafer. For example, the die separation tool may be maintained at a temperature between about 1 degree Celsius and about 3 degrees Celsius below the desired temperature of the wafer.

The die separation tool may be configured to apply an outward radial force to the wafer such that the individual microelectronic devices separate from one another along the cracks that propagated through the wafer in response to the material removal process in process act 708.

Some embodiments of the present disclosure may include a method of separating a wafer into microelectronic devices. The method may include scanning a laser beam on an interior portion of the wafer along scribe lines separating individual microelectronic device locations to form a weakened region of semiconductor material proximate a focal point of the laser beam and spaced from an active surface of the wafer. The method may further include mechanically thinning the wafer while maintaining the wafer in a cooled state. The method may also include separating the wafer along the scribe lines into separate microelectronic devices responsive to the mechanical thinning while maintaining the wafer in a cooled state.

Figure 8:
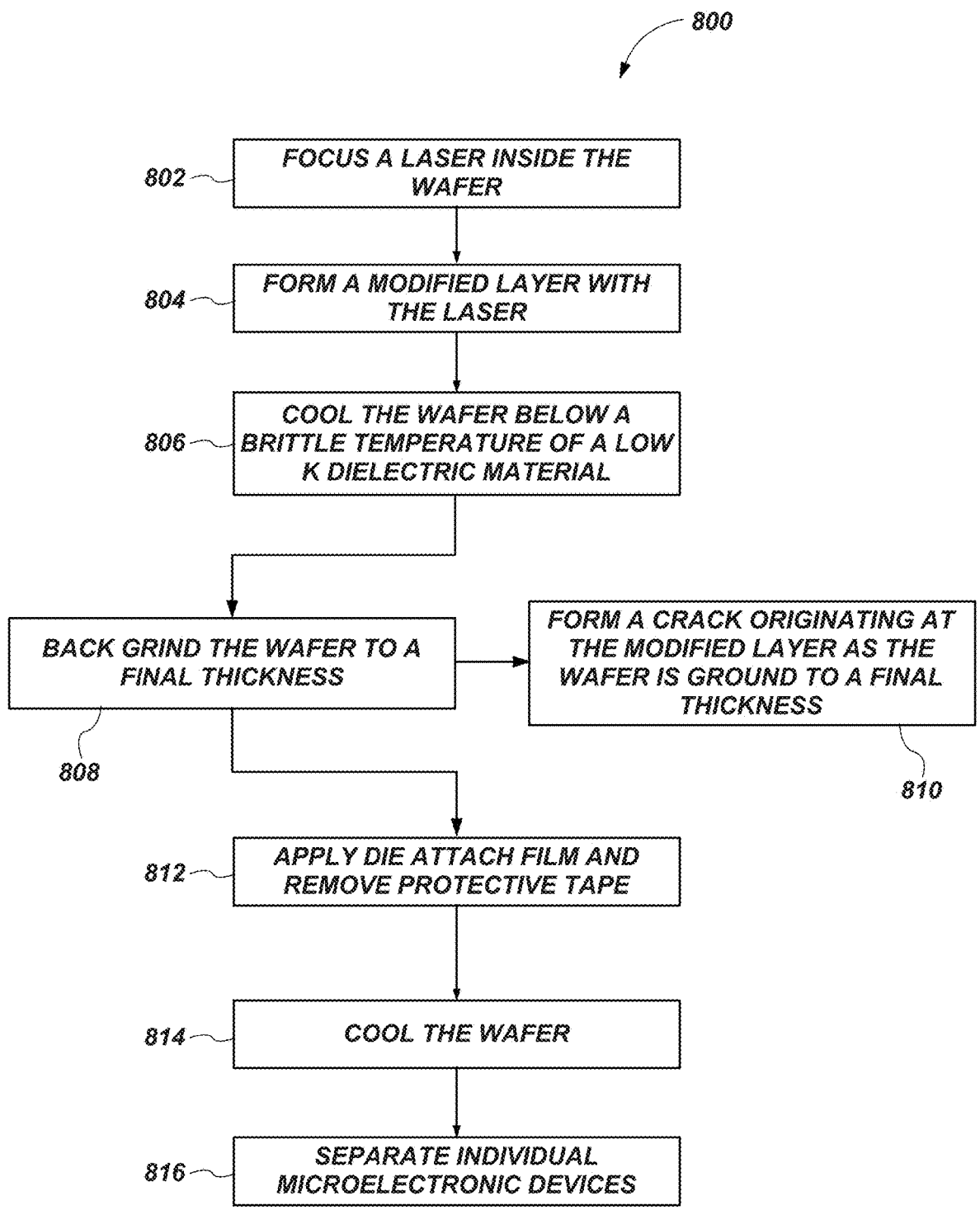
FIG. 8 illustrates a flow chart representative of a method of separating individual microelectronic devices from a wafer in accordance with an embodiment of the present disclosure.

FIG. 8 illustrates a flow chart representative of a method 800 of separating individual microelectronic devices from a wafer. Once the microelectronic devices are fabricated on a wafer the individual microelectronic devices must be separated from one another in a dicing process. The dicing process may be an SDBG process. The SDBG process may begin by focusing a laser on an interior portion of the wafer as shown in process act 802. The laser may pass through a back side of the wafer opposite the wiring and insulating layers on the active surface of the wafer.

The laser beam may be configured to selectively melt the wafer only in the area where the laser is focused. For example, the laser beam may pass through the wafer without melting the wafer material until the point in the interior portion of the wafer where the laser is focused. The selectively melted areas in the wafer may form a modified layer, also termed a scribe line, as shown in process act 804. The modified layer may correspond to streets between the individual microelectronic devices on the wafer. The modified layer may also be located in an interior portion of the wafer. In some embodiments, a distance between the modified layer and the active area portion of the microelectronic devices on the wafer may be substantially equal to the desired thickness of the individual microelectronic devices.

In some embodiments, the distance between the modified layer and the active area portion of the microelectronic devices may be greater than the desired thickness of the individual microelectronic devices. For example, the modified layer may be completely removed when the wafer is thinned in process act 808. Once the modified layer is formed by the laser in process act 804, the wafer may be cooled in process act 806. In some embodiments, the wafer may be cooled while the modified layer is formed in process acts 802 and 804. As described above, the wafer may be cooled using a cold chuck or cold table configured to secure the wafer and provide a cold contact surface to cool the wafer. The cold chuck or table may be maintained at a temperature between about the desired temperature of the wafer and about 3 degrees Celsius below the desired temperature of the wafer. The cold chuck or table may be maintained at temperatures between about −13 degrees Celsius and about 5 degrees Celsius, such as between about −10 degrees Celsius and about 5 degrees Celsius, between about −3 degrees Celsius and about 3 degrees Celsius, or between about −3 degrees Celsius and about 1 degree Celsius.

The cold chuck or table may be configured to cool the wafer to a temperature at which a low dielectric constant layer in the microelectronic devices becomes brittle. For example, the cold chuck or table may cool the wafer to a temperature between about −10 degrees Celsius and about 5 degrees Celsius, such as between about 0 degrees Celsius and about 3 degrees Celsius or between about 0 degrees Celsius and about 1 degree Celsius.

The wafer may be thinned in a back grinding process as illustrated in process act 808. The back grinding process may begin after the wafer is positioned on the cold chuck or table for enough time to lower a temperature of the wafer to a temperature near the desired temperature. The back grinding process may remove material from the rear side of the wafer until a distance between the rear side of the wafer and the topmost portion of the microelectronic devices is substantially equal to the desired thickness of the individual microelectronic devices. In some embodiments, the back grinding process may at least partially remove the modified layer. For example, the modified layer may be positioned a greater distance from the active area portion of the microelectronic devices such that grinding the wafer to a final thickness may substantially remove the modified layer. In some embodiments, the modified layer may be positioned at substantially the same distance from the active area portion of the microelectronic devices, such that the back grinding process may remove a portion of the modified layer and another portion of the modified layer may remain. In some embodiments, the modified layer may be positioned a smaller distance from the topmost portion of the microelectronic devices, such that the modified layer remains substantially intact after the back grinding process.

During the back grinding process of process act 808, stress concentrations around the modified layer may cause cracks to propagate from the modified layer through the streets between the individual microelectronic devices as illustrated in process act 810. At least one low dielectric constant layer may extend across streets between adjacent microelectronic devices. The low dielectric constant layer in the streets may be brittle at the temperature of the cooled wafer. The crack may propagate through the brittle low dielectric constant layer forming a substantially clean break between the individual microelectronic devices along the street.

After the wafer is thinned to a final thickness, a die attach film may be applied to the rear side of the wafer and a protective tape may be removed from the top surface of the microelectronic devices as illustrated in process act 812. In some embodiments, the die attach film may be configured to improve a die integrity of the individual microelectronic devices once they are separated. Depending on the application the die attach film may be conductive or non-conductive. The die attach film may be configured to assist in later stacking of microelectronic devices, such as package on package stacks, integrated circuits, etc.

Once the die attach film is applied in process act 812, the wafer may be cooled in process act 814. As described above, the wafer may be cooled using a cold chuck or cold table configured to secure the wafer and provide a cold contact surface to cool the wafer. The cold chuck or table may be maintained at a temperature between about the desired temperature of the wafer and about 3 degrees Celsius below the desired temperature of the wafer. The cold chuck or table may be maintained at temperatures between about −18 degrees Celsius and about 5 degrees Celsius, such as between about −15 degrees Celsius and about 5 degrees Celsius, between about −3 degrees Celsius and about 5 degrees Celsius, or between about −3 degrees Celsius and about 1 degree Celsius.

The cold chuck or table may be configured to cool the wafer to a temperature at which the epoxy material of the die attach film becomes brittle. For example, the cold chuck or table may cool the wafer to a temperature between about −15 degrees Celsius and about 5 degrees Celsius, such as between about 0 degrees Celsius and about 5 degrees Celsius or between about 0 degrees Celsius and about 1 degree Celsius. In one non-limiting example, a sufficiently low temperature is about 5 degrees Celsius.

When the wafer has been in contact with the cold chuck or table for sufficient time to be near the desired temperature the wafer may be expanded with a device such as a roller table, dicing tape expander, wafer expander, etc., configured to introduce an outward radial force on die attach film such that the die attach film expands and the wafer fractures along the cracks formed in process act 810. As the wafer expands and the die attach film and wafer fractures, the wafer may be separated into individual microelectronic devices as shown in process act 816.

Some embodiments of the present disclosure may include an apparatus for thinning a wafer. The apparatus may include a wafer securing tool comprising a table for mounting a semiconductor wafer thereon. The apparatus may further include a cooling apparatus operably coupled to the wafer securing tool for cooling and maintaining a semiconductor wafer mounted thereon at a temperature between about 5 degrees Celsius and −10 degrees Celsius. The apparatus may also include a material removal tool configured and positioned to mechanically remove material from a semiconductor wafer mounted to the table of the wafer securing tool.

Figure 9:
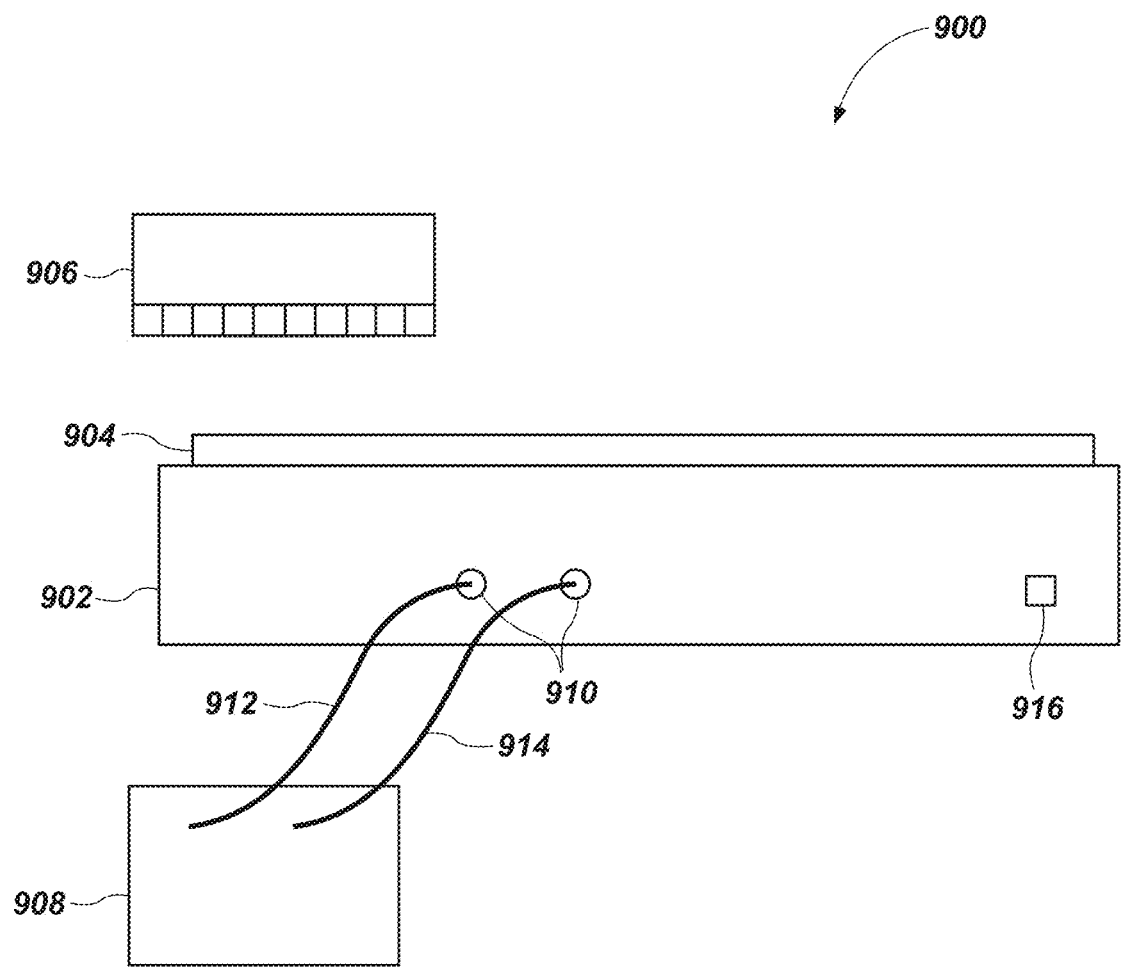
FIG. 9 is a schematic illustration of an apparatus for thinning a wafer subsequent to Stealth Dicing Before Grind (SDBG)

FIG. 9 illustrates an apparatus 900 for thinning a wafer. The apparatus may include a wafer securing tool 902 (e.g., chuck, table) configured to secure a wafer 904 during a thinning process. The apparatus may include a material removal tool 906 configured to remove material from the wafer 904. In some embodiments, the material removal tool 906 may be configured to mechanically remove material from the 904. For example, the material removal tool 906 may be a grinding platen.

The wafer securing tool 902 may be configured to lower a temperature of the wafer 904 during the thinning process.

For example, the wafer securing tool 902 may be maintained at a low temperature such that contact between the wafer 904 and the wafer securing tool 902 may lower the temperature of the wafer 904. As described above, the wafer securing tool 902 may be maintained at a temperature below a desired temperature of the wafer 904. In some embodiments, the wafer securing tool 902 may include a cold chuck or a cold table.

The apparatus may include a cooling apparatus 908 configured to maintain the wafer securing tool 902 at the lower temperature. The cooling apparatus 908 may be configured to cool the wafer securing tool 902 with a cooling fluid. The cooling fluid may include cooling gasses or liquids. For example, the cooling fluid may be a water and antifreeze mixture, a refrigerant, ammonia, a cryogenic fluid, or a gas. In some embodiments, the cooling apparatus 908 may employ a refrigeration process to remove heat from the cooling fluid. For example, the cooling fluid may pass through a compressor when returning to the cooling apparatus 908 from the wafer securing tool 902. The compressor may raise a temperature of the cooling fluid before passing the cooling fluid through a condenser. The condenser may be a heat exchanger configured to remove heat from the cooling fluid. After the condenser the cooling fluid may pass through an expansion valve configured to lower a pressure of the cooling fluid such that a temperature of the cooling fluid drops to a lower temperature. For example, the expansion valve may cause the phase of the cooling fluid to change (e.g., from a gas to a liquid). The lower temperature cooling fluid may then pass through the wafer securing tool 902 cooling the wafer securing tool 902.

In some embodiments, the cooling apparatus 908 may include a heat exchanger configured to transfer heat from the cooling fluid to another fluid, such as another refrigerant. The cooling apparatus 908 may then employ the refrigeration process to remove heat from the other fluid. For example, if the cooling fluid is a water and antifreeze mixture, the water and antifreeze mixture may pass through a heat exchanger and transfer heat to a refrigerant. The refrigerant may then proceed through the refrigeration process such that the refrigerant in the heat exchanger is maintained at a lower temperature than a desired temperature of the water and antifreeze mixture.

The cooling fluid may be supplied from the cooling apparatus 908 through a supply cooling line 912 coupled to a cooling port 910 in the wafer securing tool 902. The cooling fluid may pass through one or more internal passageways in the wafer securing tool 902 before returning to the cooling apparatus 908 through a return cooling line 914 coupled to another cooling port 910. In some embodiments, the wafer securing tool 902 may include multiple cooling ports 910 coupled to multiple supply cooling lines 912 and return cooling lines 914. For example, the cooling apparatus 908 may include two or more supply cooling lines 912 and one or more return cooling line 914. The wafer securing tool 902 may include at least a corresponding number of cooling ports 910 such that each of the supply cooling lines 912 and return cooling lines 914 may be coupled to a separate cooling port 910.

In some embodiments, the wafer securing tool 902 may include a sensor 916 configured to control the cooling apparatus 908. For example, the sensor 916 may provide the temperature of the wafer securing tool 902 to the cooling apparatus 908. The temperature reading from the sensor 916 may be compared to a desired temperature of the wafer securing tool 902. If the temperature of the wafer securing tool 902 is higher than the desired temperature more cooling fluid may be provided to the wafer securing tool 902. Alternatively, if the temperature of the wafer securing tool 902 is lower than the desired temperature less cooling fluid may be provided to the wafer securing tool 902. In some embodiments, the temperature of the cooling fluid may be controlled by the sensor 916 rather than a flow of the cooling fluid. In some embodiments, the sensor 916 may measure a temperature of the cooling fluid. For example, the sensor 916 may measure a temperature of the cooling fluid in the return cooling line 914 and compare the temperature to a desired temperature of the wafer securing tool 902. In some embodiments, the sensor 916 may measure a temperature of the cooling fluid in the supply cooling line 912 and compare the temperature to a desired temperature of the cooling fluid.

The embodiments of the present disclosure may enable a microelectronic device fabrication operation to form thinner microelectronic devices, while maintaining integrity of the microelectronic devices and reducing failures in the microelectronic devices. Thinner microelectronic devices may enable downstream products utilizing the microelectronic devices to be smaller and/or thinner. Further, yield of microelectronic devices from a wafer may improve, infant mortality may decrease and reliability of the microelectronic devices may increase.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method, comprising:
    supporting a semiconductor wafer comprising microelectronic devices including a low k dielectric material over an active surface thereof;
    scanning a laser beam into the semiconductor wafer from a back side thereof along scribe lines between adjacent microelectronic devices with a focal point of the laser at a depth inside the semiconductor wafer;
    cooling the semiconductor wafer from a room temperature to a temperature less than 5 degrees Celsius where the low k dielectric material is brittle; and
    mechanically thinning the cooled semiconductor wafer from the back side of the cooled semiconductor wafer and inducing separation of the microelectronic devices along the scribe lines.

2. The method of claim 1, wherein cooling the semiconductor wafer further comprises positioning the semiconductor wafer on a cold wafer chuck table.

3. The method of claim 2, further comprising maintaining the cold wafer chuck table at a temperature below a desired temperature of the semiconductor wafer.

4. The method of claim 3, further comprising maintaining the semiconductor wafer at a temperature between about −10 degrees Celsius and about 5 degrees Celsius.

5. The method of claim 3, further comprising maintaining the semiconductor wafer at a temperature between about 0 degrees Celsius and about 3 degrees Celsius.

6. The method of claim 3, further comprising maintaining a temperature difference between the cold wafer chuck table and the desired temperature of the semiconductor wafer between about 0 degrees Celsius and about 3 degrees Celsius.

7. The method of claim 1, wherein inducing separation of the microelectronic devices comprises forming cracks corresponding to the scribe lines extending into material of the semiconductor wafer and through the low k dielectric material.

8. The method of claim 1, wherein the scribe lines correspond to streets devoid of integrated circuitry between the separate microelectronic devices.

9. The method of claim 1, further comprising cooling the semiconductor wafer to a temperature below room temperature before scanning the laser beam into the semiconductor laser.

10. A method of separating a wafer into microelectronic devices comprising:
    scanning a laser beam on an interior portion of the wafer along scribe lines separating individual microelectronic device locations to form a weakened region of a semiconductor material; proximate a focal point of the laser beam and spaced from an active surface of the wafer;
    cooling the semiconductor wafer from a room temperature to a temperature lower than the room temperature;
    mechanically thinning the wafer while maintaining the wafer at the temperature lower than the room temperature; and
    separating the wafer along the scribe lines into separate microelectronic devices responsive to the mechanical thinning while maintaining the wafer in the cooled state.

11. The method of claim 10, wherein mechanically thinning the wafer comprises thinning the wafer to a thickness is between about 8 microns and about 100 microns.

12. The method of claim 10, further comprising melting the interior portion of the wafer proximate the focal point of the laser beam to form the weakened region.

13. The method of claim 12, further comprising melting the interior portion a distance from an active surface of the wafer and adjacent a selected thickness of the wafer from mechanical thinning.

14. The method of claim 13, wherein mechanically thinning comprises back grinding.

15. The method of claim 10, wherein mechanically thinning the wafer while maintaining the wafer in the cooled state comprises maintaining the wafer at a temperature between about −10 degrees Celsius and about 5 degrees Celsius.

16. An apparatus for thinning a wafer comprising:
    a wafer securing tool comprising a table for mounting a semiconductor wafer thereon;
    a cooling apparatus operably coupled to the wafer securing tool for cooling and maintaining the semiconductor wafer mounted thereon at a temperature between about 5 degrees Celsius and −10 degrees Celsius; and
    a material removal tool comprising a back grinding tool configured and positioned to mechanically remove material from the semiconductor wafer mounted to the table of the wafer securing tool.

17. The apparatus of claim 16, wherein the wafer securing tool comprises a cold chuck.

18. The apparatus of claim 16, wherein the cooling apparatus employs a cooling fluid.

19. The apparatus of claim 18, wherein the cooling fluid comprises a water and antifreeze mixture, a refrigerant, ammonia, a cryogenic fluid, or a gas.

20. The apparatus of claim 16, further comprising a laser configured to focus on an interior portion of the semiconductor wafer along scribe lines separating individual microelectronic device locations to form a weakened region of semiconductor wafer proximate a focal point of the laser beam prior to thinning of the wafer while the semiconductor wafer is mounted to the wafer securing tool in a cooled state.

21. A stealth dicing method comprising:
    focusing a laser beam within a wafer comprising multiple microelectronic devices to form scribe lines comprising modified semiconductor material between the multiple microelectronic devices;
    thinning the wafer while the wafer is maintained at a cold temperature of less than 5 degrees Celsius to cause a dielectric material of the multiple microelectronic devices in alignment with the scribe lines to become brittle; and
    fracturing the thinned wafer and the dielectric materials of the multiple microelectronic devices along boundaries corresponding to the scribe lines.

22. The stealth dicing method of claim 21, wherein causing dielectric material of the multiple microelectronic devices in alignment with the scribe lines to become brittle comprises causing a low k interlayer dielectric material to become brittle.

23. The stealth dicing method of claim 21, wherein fracturing the thinned wafer and the dielectric materials of the multiple microelectronic devices comprises forming cracks originating at the modified semiconductor material and extending through the thinned wafer and between adjacent microelectronic devices.

24. The stealth dicing method of claim 21, wherein the wafer is maintained at a temperature below room temperature while focusing the laser beam within the wafer.

* * * * *